(12) United States Patent
Ueda et al.

(10) Patent No.: US 7,142,447 B2
(45) Date of Patent: Nov. 28, 2006

(54) NONVOLATILE MEMORY DEVICE WITH VARIABLE RESISTANCE ELEMENT

(75) Inventors: Yoshihiro Ueda, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/133,383

(22) Filed: May 20, 2005

(65) Prior Publication Data

US 2006/0198224 A1    Sep. 7, 2006

(30) Foreign Application Priority Data

Mar. 3, 2005  (JP) .............................. 2005-059261

(51) Int. Cl.
*G11C 11/00* (2006.01)
(52) U.S. Cl. .................. 365/158; 365/171; 365/173
(58) Field of Classification Search ................ 365/158, 365/171, 173
See application file for complete search history.

(56) References Cited

U.S. PATENT DOCUMENTS 6,795,334 B1 *  9/2004  Iwata et al. .................. 365/158
6,826,076 B1 * 11/2004  Asano et al. ................. 365/158
6,944,048 B1 *  9/2005  Iwata ........................... 365/158

FOREIGN PATENT DOCUMENTS

JP       2003-249072        9/2003

* cited by examiner

*Primary Examiner*—Anh Phung
(74) *Attorney, Agent, or Firm*—Oblon, Spivak, McClelland, Maier & Neustadt, P.C.

(57) ABSTRACT

A magnetic memory device includes a plurality of variable resistance elements arranged in parallel between a first and second nodes and having resistance values which vary depending on data stored in the elements, a selection transistor connected to the first node to perform selection on the plurality of variable resistance elements, and a bit line connected to the second node. A plurality of current paths including the variable resistance elements between the first and second nodes have different resistance values.

16 Claims, 6 Drawing Sheets

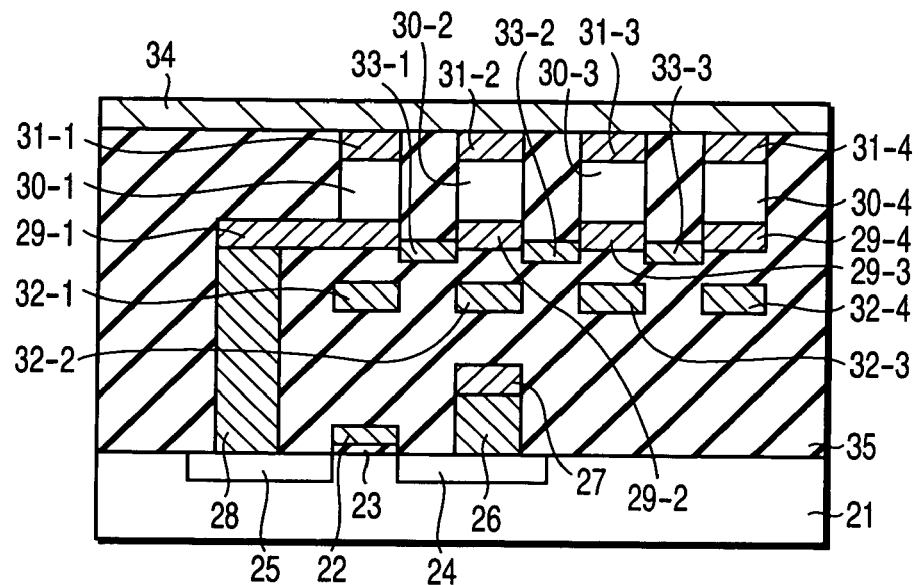
F I G. 2
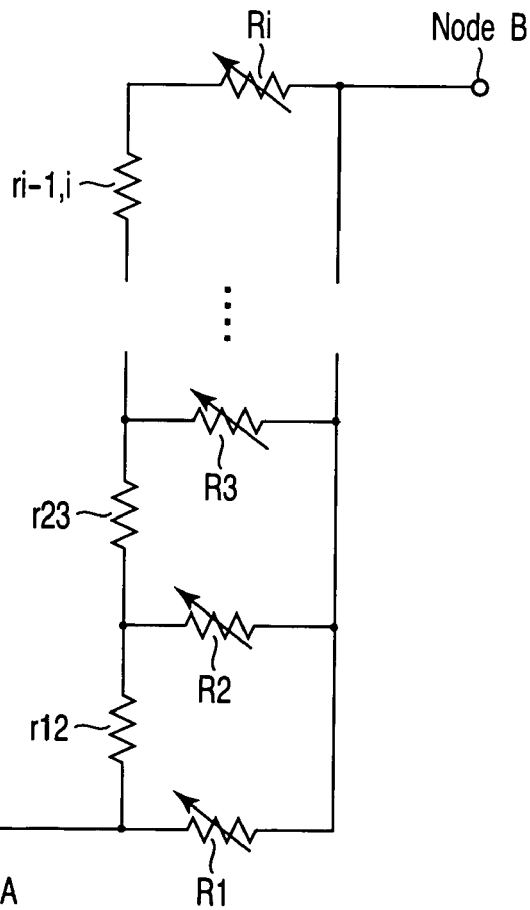
F I G. 3

NONVOLATILE MEMORY DEVICE WITH VARIABLE RESISTANCE ELEMENT

CROSS-REFERENCE TO RELATED APPLICATIONS

This application is based upon and claims the benefit of priority from prior Japanese Patent Application No. 2005-059261, filed Mar. 3, 2005, the entire contents of which are incorporated herein by reference.

BACKGROUND OF THE INVENTION

1. Field of the Invention

The present invention relates to a magnetic memory device, and in particular, to a magnetic memory device that uses magnetoresistive elements as memory cells.

2. Description of the Related Art

In recent years, a magnetic random access memory (MRAM) has been proposed which is a nonvolatile memory utilizing memory cells composed of variable resistance elements that can store data on the basis of a variation in electrical resistance. For example, in the MRAM, memory cells are composed of Magnetic Tunnel Junction (MTJ) elements.

The MTJ element comprises a magnetic recording layer (also referred to as a free layer) in which the direction of magnetization varies depending on an external magnetic field and a magnetization fixing layer (also referred to as a pinned layer) in which the direction of magnetization is fixed so as to remain unchanged. The MTJ element has two reference values depending on the relative relationship between the directions of magnetization in the free layer and in the pinned layer; the MTJ has a resistance value Rp when the directions are parallel and a resistance value Ra when they are antiparallel. Data is stored by associating the resistance value Rp with data "0", while associating the resistance value Ra with data "1".

Data is written to the MTJ element by passing at least a specified current through a corresponding bit and word lines passing through the memory cell so as to cross at right angles and controlling the direction of magnetization in the free layer of the MTJ element in accordance with the magnitude of a composite magnetic field resulting from the current. Data is read by reading a voltage value at a specified current or a current value at a specified voltage as the resistance value of the MTJ element.

The MTJ element has one end electrically connected to a bit line and the other end electrically connected to a selection transistor. That is, one selection transistor corresponds to one MTJ element. Thus, for example, the area of a cell is determined by a region for the selection transistor which is composed of a metal oxide semiconductor field effect transistor (MOSFET). This precludes MTJ elements from being densely arranged, thus preventing an increase in the degree of integration of the MRAM.

A related technique has been proposed which comprises an MRAM having a cell array structure suitable for an increase in the degree of integration of cells (see Jpn. Pat. Appln. KOKAI Application No. 2003-249072).

BRIEF SUMMARY OF THE INVENTION

According to a first aspect of the present invention, there is provided a magnetic memory device comprising: a plurality of variable resistance elements arranged in parallel between a first and second nodes and having resistance values which vary depending on data stored in the elements; a selection transistor connected to the first node to perform selection on the plurality of variable resistance elements; and a bit line connected to the second node. A plurality of current paths including the variable resistance elements between the first and second nodes have different resistance values.

According to a second aspect of the present invention, there is provided a magnetic memory device comprising: a plurality of variable resistance elements arranged in parallel between a first and second nodes and having resistance values which vary depending on data stored in the variable resistance elements; a plurality of fixed resistance elements each connected between terminals of one of the variable resistance elements and the adjacent variable resistance element, which terminals are located on the same side of the variable resistance elements, the fixed resistance elements having fixed resistance values; a selection transistor connected to the first node to perform selection on the plurality of variable resistance elements; and a bit line connected to the second node.

BRIEF DESCRIPTION OF THE SEVERAL VIEWS OF THE DRAWING

FIG. 2 is a sectional view showing the configuration of a block 12 shown in FIG. 1;

FIG. 3 is a circuit diagram showing a block including i MTJ elements;

DETAILED DESCRIPTION OF THE INVENTION

Figure 1:
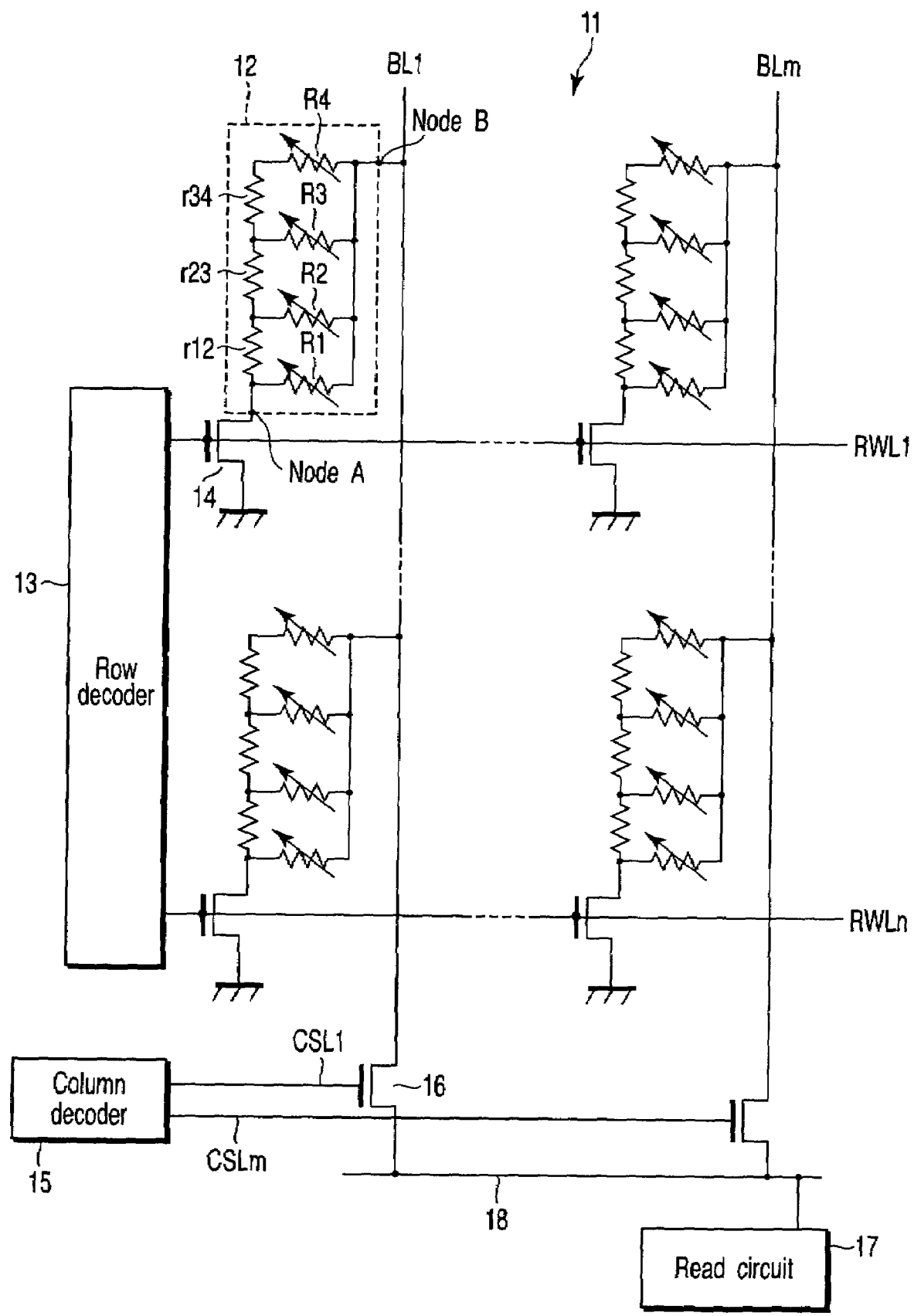
FIG. 1 is a circuit diagram showing the configuration of an MRAM according to a first embodiment of the present invention.

Embodiments of the present invention will be described blow with reference to the drawings. In the description below, elements having the same functions and configurations are denoted by the same reference numerals. Duplicate descriptions are given only when required.

(First Embodiment)

FIG. 1 is a circuit diagram showing the configuration of an MRAM according to a first embodiment of the present invention. A memory cell array 11 comprises a plurality of blocks 12. Each of the blocks 12 comprises a plurality of variable resistance elements R. FIG. 1 shows that each block 12 comprises four variable resistance elements R.

The variable resistance element R is composed of, for example, an MTJ element (or TMR (Tunneling Magnetoresistive) element). The structure of the MTJ element is not particularly limited. An example of the structure will be shown below. The MTJ element comprises a pinned layer), a free layer, and a tunnel barrier layer placed between the pinned layer and the free layer.

The pinned layer is composed of a ferromagnetic layer in which the direction of magnetization fixed so as to remain unchanged. Specifically, the pinned layer is composed of the ferromagnetic layer and an antiferromagnetic layer added to the ferromagnetic layer so as to prevent a change in the direction of magnetization.

The free layer is composed of a ferromagnetic layer in which the direction of magnetization is reversed depending on an external magnetic field. The tunnel barrier layer is composed of an insulating layer.

The MTJ element has a smaller resistance value if the directions of magnetization in the free layer and in the pinned layer are parallel (in this case, the resistance value is referred to as Rp). On the other hand, the MTJ element has a larger resistance value if the directions of magnetization in the free layer and in the pinned layer are antiparallel (in this case, the resistance value is referred to as Ra). Accordingly, data can be stored by for example, associating binary information data "0" and "1" with the resistance values Rp and Ra, respectively.

Four variable resistance elements R1 to R4 constituting the block 12 are connected together in parallel between node A and node B. Moreover, a fixed resistance element r is provided between terminals of two adjacent resistance elements R which are located on the same side of the elements R.

A fixed resistance element r12 is connected between node-A-side terminals of the variable terminal elements R1 and R2. A fixed resistance element r23 is connected between node-A-side terminals of the variable terminal elements R2 and R3. A fixed resistance element r34 is connected between node-A-side terminals of the variable terminal elements R3 and R4.

In the present embodiment, the plurality of MTJ elements included in one block have the same resistance value Ra and the same resistance value Rp, that is, the same characteristics. In this case, the same resistance value may be substantially the same resistance value and contains an industrially tolerable range of errors.

In general, MTJ elements having different resistance values have different write characteristics corresponding to magnetization reversal characteristics. Accordingly, by using MTJ elements having the same resistance values, it is possible to write data to the MTJ elements having the same write characteristics. Consequently, compared to the use of MTJ elements having different resistance values, that is, different write characteristics, the configuration of a circuit can be simplified which is used to generate a write current. Moreover, a manufacturing process can be simplified.

Further, a plurality of read/write bit lines BL1 to BLm are arranged in MRAM so as to extend in a column direction. A plurality of read word lines RWL1 to RWLm are also arranged in MRAM so as to extend in a row direction.

In FIG. 1, the illustration of write word lines WWL is omitted which lines are used to write data to the variable resistance element R.

A plurality of blocks 12 are arranged at each of the intersection points between the plurality of read/write bit lines BL and the plurality of read word lines RWL. A node A is grounded via a corresponding one of a plurality of read selection transistors 14. A gate of the read selection transistor 14 is connected to a corresponding one of the plurality of read word lines RWL.

A node B is connected to a corresponding one of the plurality of read/write bit lines BL. The plurality of read/write bit lines BL are connected to a common data line 18 via a plurality of column selection transistors 16. A plurality of column selection signals CSL1 to CSLm are input to gates of the respective column selection transistors 16.

The common data line 18 is connected to a read circuit 17. The read circuit 17 reads a value for a current flowing through the common data line 18 (or a value for the voltage across the common data line 18).

MRAM comprises a row decoder 13 and a column decoder 15. In a read operation, the row decoder 13 selects any of the read word lines RWL on the basis of an externally input row address signal. In the read operation, the column decoder 15 selects any of the read/write bit lines BL on the basis of an externally input column address signal.

In a write operation, the row decoder 13 selects any of the write word lines WWL (not shown) on the basis of a row address signal. A write word line driver (not shown) supplies a write current to the selected write word line WWL. The write current flows through the selected write word line WWL and is absorbed by a write word line sinker (not shown).

FIG. 2 is a sectional view showing the configuration of one of the blocks 12 shown in FIG. 1. The read selection transistor 14 is placed on an area of a semiconductor substrate 21.

That is, a gate electrode 22 is provided on the semiconductor substrate 21 via a gate insulating film 23. The gate electrode 22 corresponds to the read word line RWL. A source region 24 and a drain region 25 are provided in the semiconductor substrate 21 on the respective sides of the gate electrode 22.

A source line 27 is provided above the source region 24 via a contact plug 26. The source region 24 is connected to a ground point via the source line 27.

A conductive layer 29-1 serving as a lower terminal is provided above the drain region 25 via a contact plug 28. An MTJ element 30-1 serving as the variable resistance element R1 is provided on the conductive layer 29-1. One terminal of the MTJ element 30-1 is electrically connected to the conductive layer 29-1.

A read/write bit line (BL) 34 is provided above the MTJ element 30-1 via a conductive layer 31-1 serving as an upper element. The other terminal of the MTJ element 30-1 is electrically connected to the conductive layer 31-1. A write word line (WWL) 32-1 is provided below the MTJ element 30-1.

A conductive layer 29-2 is provided adjacent to the conductive layer 29-1. A fixed resistance element (r) 33-1 is provided between the conductive layers 29-1 and 29-2. An MTJ element 30-2 is provided above the conductive layer 29-2. The other terminal of the MTJ element 30-2 is connected to a common bit line 34 via a conductive layer 31-2. A write word line (WWL) 32-2 is provided below the MTJ element 30-2.

Similarly, an MTJ element 30-3 is provided adjacent to the MTJ element 30-2. Terminals of the MTJ element 30-2 and MTJ element 30-3 which are located on the same side of the elements 30-2 and 30-3 are electrically connected together by the fixed resistance element 33-2.

Moreover, an MTJ element 30-4 is provided adjacent to the MTJ element 30-3. Terminals of the MTJ element 30-4 and MTJ element 30-3 which are located on the same side of the elements 30-4 and 30-3 are connected together via a fixed resistance element 33-3. Further, an insulating layer 35 is provided between the semiconductor substrate 21 and the common bit line 34.

Polysilicon, ruthenium oxide, or the like may be used as the fixed resistance elements 33-1 to 33-3.

Now, the composite resistance of the block 12 will be described. One block is assumed to include i MTJ elements (see FIG. 3).

The resistance values of the MTJ elements R1 to Ri are defined as $R_1$ to $R_i$, respectively. The resistance value of the fixed resistance element is defined as "r" (that is, r12=r23=~=ri-i, i=r). When the composite resistance value of a block composed of i MTJ elements and (i-1) fixed resistance elements is defined as $T_i$, the following equation is given:

$$\frac{1}{T_N} = \frac{1}{T_{N-1} + r} + \frac{1}{R_N}$$

$$T_1 = R_1$$

This equation allows the composite resistance of the block to be calculated.

Figure 4:
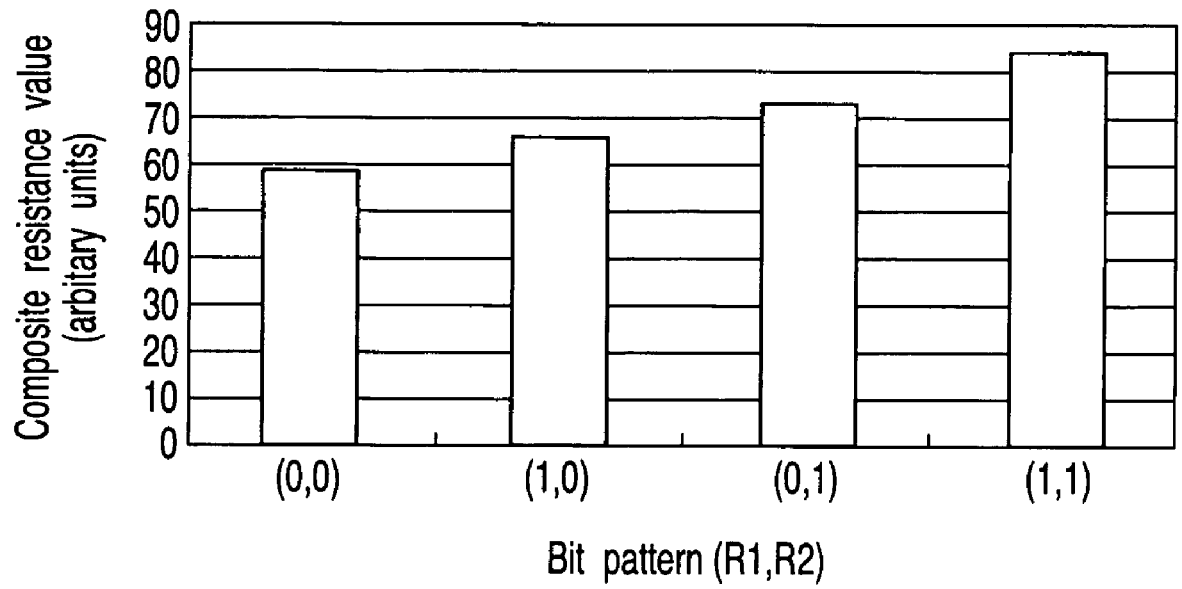
FIG. 4 is a graph showing the composite resistance value of a block 12 that includes two MTJ elements.

FIG. 4 is a graph showing the composite resistance value of the block for i=2. In this case, a resistance value Rp of 100 is obtained if the directions of magnetization in the free layer and in the pinned layer are parallel. A resistance value Ra of 150 is obtained if the directions of magnetization in the free layer and in the pinned layer are antiparallel. Further, r12=40. Units are arbitrary. FIG. 4 shows composite resistance values for the respective bit patterns stored in the MTJ elements R1 and R2.

As shown in FIG. 4, the composite resistance value of the block varies depending on the data stored in the MTJ elements R1 and R2. Accordingly, data stored in the MTJ elements R1 and R2 can be read by passing a specified current between the node A and the node B or applying a specified voltage to between the node A and the node B. In other words, the data stored in the MTJ elements R1 and R2 can be read so that their bit patterns can be accurately distinguished from each other.

Figure 5:
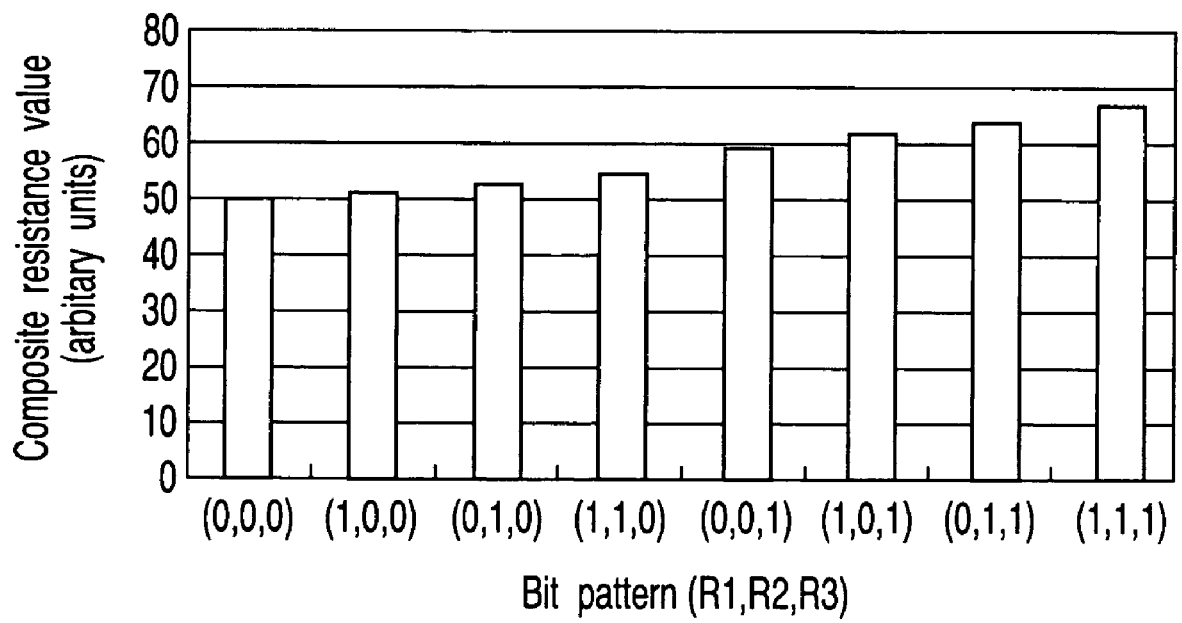
FIG. 5 is a graph showing the composite resistance value of a block 12 that includes three MTJ elements.

FIG. 5 is a graph showing the composite resistance value of the block for i=3. The resistance value Rp=100, the resistance value Ra=150, and r12=r23=40.

As shown in FIG. 5, even with an increase in the number of MTJ elements, the composite resistance value of the block varies depending on data stored in the MTJ elements R1, R2, and R3. Accordingly, the data stored in the MTJ elements R1, R2, and R3 can be read so that their bit patterns can be accurately distinguished from each other.

Similarly, a block composed of i MTJ elements and (i-1) fixed resistance elements has "$2^i$" different composite resistance values. This enables data stored in the i MTJ elements R1 to Ri to be read.

As shown in FIG. 4, for i=2 (that is, the number of MTJ elements is 2), there are large differences among the composite resistance values of the bit patterns. Accordingly, for i=2, data can be more accurately read.

As described above, according to the present invention, a plurality of MTJ elements can be assigned to a single read selection transistor. This makes it possible to reduce the number of read selection transistors required, thus enabling a highly integrated MRAM to be constructed.

Further, a reduction in the number of read selection transistors makes it possible to reduce the number of read word lines RWL required. This enables a highly integrated MRAM to be constructed.

In the present embodiment, the plurality of MTJ elements included in one block have the same resistance value Ra and the same resistance value Rp, that is, the same characteristics. Further, the plurality of fixed resistance elements have the same resistance value.

However, the present invention is not limited to this. The MTJ elements may have different resistance values. The fixed resistance elements may have different resistance values. That is, even if the plurality of MTJ elements have different resistance values, the composite resistance value of each bit pattern can be adjusted by controlling the resistance values of the fixed resistance elements added.

Furthermore, in the present embodiment, the fixed resistance elements are used to vary the resistance values of the plurality of current paths passing through the plurality of MTJ elements. However, the resistance values of the plurality of current paths can be varied on the basis of the characteristics (that is, resistance values) of the plurality of MTJ elements. This makes it possible to vary the composite resistance value of the block for each bit pattern without using any fixed resistance elements.

Thus configured MRAM can exert effects similar to those described without using any fixed resistance elements. The characteristics of the MTJ elements can be varied on the basis of the area of the cell.

(Second Embodiment)

A second embodiment is a variation of the first embodiment in which the positions of the variable resistance elements are changed.

Figure 6:
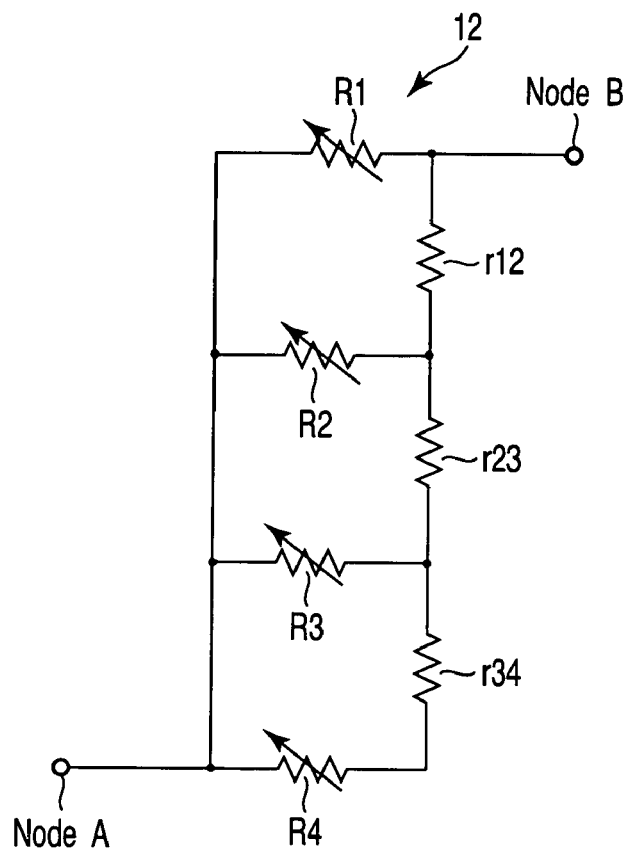
FIG. 6 is a circuit diagram showing the block 12 included in an MRAM according to the second embodiment.

FIG. 6 is a circuit diagram showing one of the blocks 12 included in an MRAM according to the second embodiment of the present invention. The four variable resistance elements R1 to R4 constituting the block 12 are connected together in parallel between the node A and the node B.

The fixed resistance element r12 is connected between node-B-side terminals of the variable terminal elements R1 and R2. The fixed resistance element r23 is connected between node-B-side terminals of the variable terminal elements R2 and R3. The fixed resistance element r34 is connected between node-B-side terminals of the variable terminal elements R3 and R4. The remaining part of the configuration is the same as that shown in FIG. 1.

Figure 7:
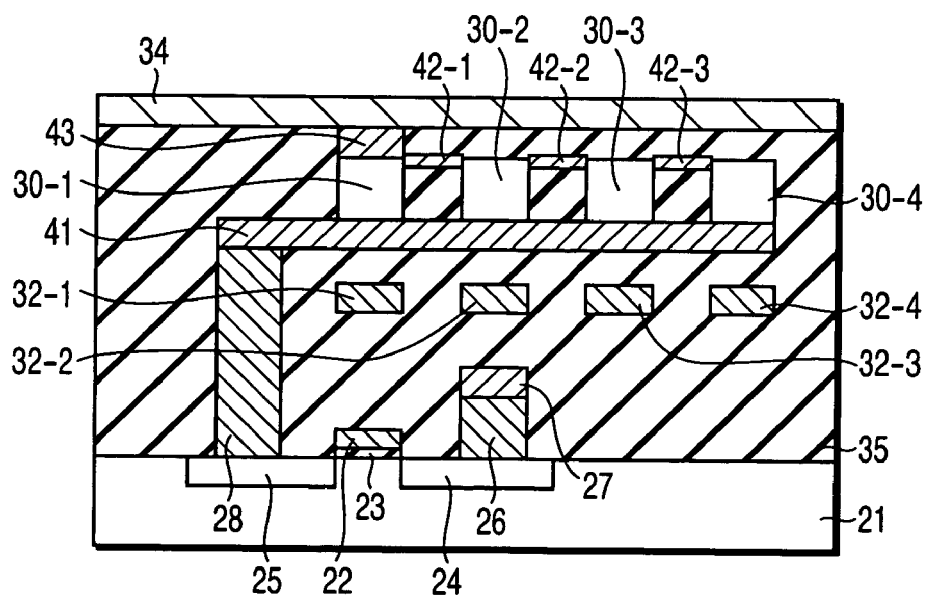
FIG. 7 is a sectional view showing the configuration of the block 12 shown in FIG. 6.

FIG. 7 is a sectional view showing the configuration of the block 12 shown in FIG. 6. A conductive layer 41 serving as a lower terminal is provided above the drain region 25 via the contact plug 28.

The MTJ elements 30-1 to 30-4 serving as variable resistance elements are provided on the conductive layer 41 adjacent to one another at intervals. One terminal of each of the MTJ elements 30-1 to 30-4 is electrically connected to the conductive layer 41.

The read/write bit line (BL) 34 is provided above the MTJ element 30-1 via a conductive layer 43 serving as an upper element.

A fixed resistance element 42-1 is provided between bit-line-side terminals of the MTJ elements 30-1 and 30-2. A fixed resistance element 42-2 is provided between bit-line-side terminals of the MTJ elements 30-2 and 30-3. A fixed resistance element 42-3 is provided between bit-line-side terminals of the MTJ elements 30-3 and 30-4.

With the MRAM configured as described above, the composite resistance value of the block varies depending on the data stored in the four MTJ elements. Accordingly, the data stored in the MTJ elements R1 to R4 can be read by passing a specified current between the node A and the node B. The other effects are similar to those of the first embodiment.

(Third Embodiment)

Figure 8:
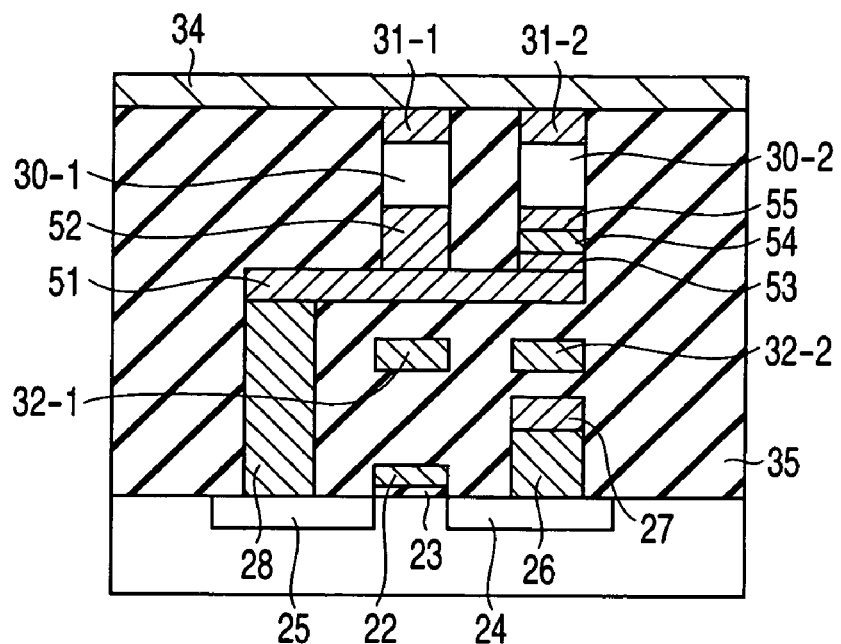
FIG. 8 is a sectional view showing the configuration of an MRAM according to a third embodiment of the present invention.

FIG. 8 is a sectional view showing the configuration of an MRAM according to a third embodiment of the present invention. In the present embodiment, the plurality of MTJ elements included in one block have the same resistance value, that is, the same characteristic. Further, the plurality of fixed resistance elements included in one block have the same resistance value. FIG. 8 shows that one block includes two MTJ elements.

A conductive layer 51 is provided above the drain region 25 via the contact plug 28. The MTJ element 30-1 serving as a variable resistance element is provided above the conductive layer 51 via a conductive layer 52. The read/write bit line (BL) 34 is provided above the MTJ element 30-1 via a conductive layer 31-1.

The MTJ element 30-2 and a fixed resistance element 54 are provided adjacent to the MTJ element 30-1. That is, the conductive layer 53, the fixed resistance element 54, and the conductive layer 55 are sequentially stacked on the conductive layer 51. The MTJ element 30-2 is provided on the conductive layer 55. The MTJ element 30-2 is connected to the common bit line 34 via the conductive layer 31-2.

The fixed resistance element 54 may be selected from a group consisting of a fixed MTJ element with a fixed resistance value, a tunnel barrier film (for example, alumina or a silicon oxide film), polysilicon, ruthenium oxide, and the like. The fixed MTJ element is constructed by sequentially stacking a pinned layer, a tunnel barrier layer, and a pinned layer. This construction enables the formation of a fixed MTJ element with a fixed resistance value.

Figure 9:
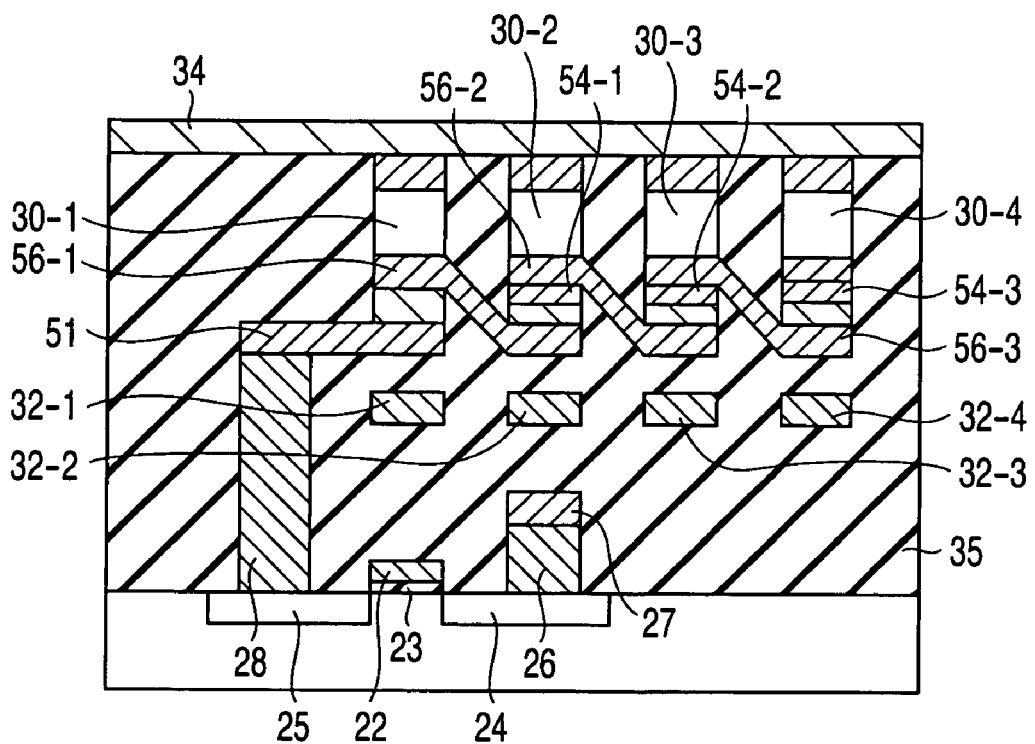
FIG. 9 is a sectional view showing the configuration of the MRAM having four MTJ elements.

FIG. 9 is a sectional view showing the configuration of an MRAM with four MTJ elements. The conductive layer 51 is connected to the lower terminal of the MTJ element 30-1 via a conductive layer 56-1. The lower terminal of the MTJ element 30-1 is connected to one terminal of a fixed resistance element 54-1 via the conductive layer 56-1. The other terminal of the fixed resistance terminal 54-1 is connected to the lower terminal of the MTJ element 30-2 via a conductive layer 56-2.

The lower terminal of the MTJ element 30-2 is connected to one terminal of a fixed resistance element 54-2 via the conductive layer 56-2. The other terminal of the fixed resistance terminal 54-2 is connected to the lower terminal of the MTJ element 30-3 via a conductive layer 56-3.

The lower terminal of the MTJ element 30-3 is connected to one terminal of a fixed resistance element 54-3 via the conductive layer 56-3. The other terminal of the fixed resistance terminal 54-3 is connected to the lower terminal of the MTJ element 30-4 via a conductive layer.

The MRAM configured as described above can exert effects similar to those of the first embodiment. Moreover, the plurality of MTJ elements use the same resistance value (that is, the same characteristic). This makes it possible to make the plurality of MTJ elements into the same shape, thus simplifying the manufacturing process.

Further, in the present embodiment, the fixed resistance element is stacked on the conductive layer. Accordingly, it is possible to simplify the manufacturing step compared to the fixed resistance element shown in FIG. 2 for the first embodiment.

(Fourth Embodiment)

A fourth embodiment is a variation of the third embodiment in which the fixed resistance element is provided on the read/write bit line (BL) 34.

Figure 10:
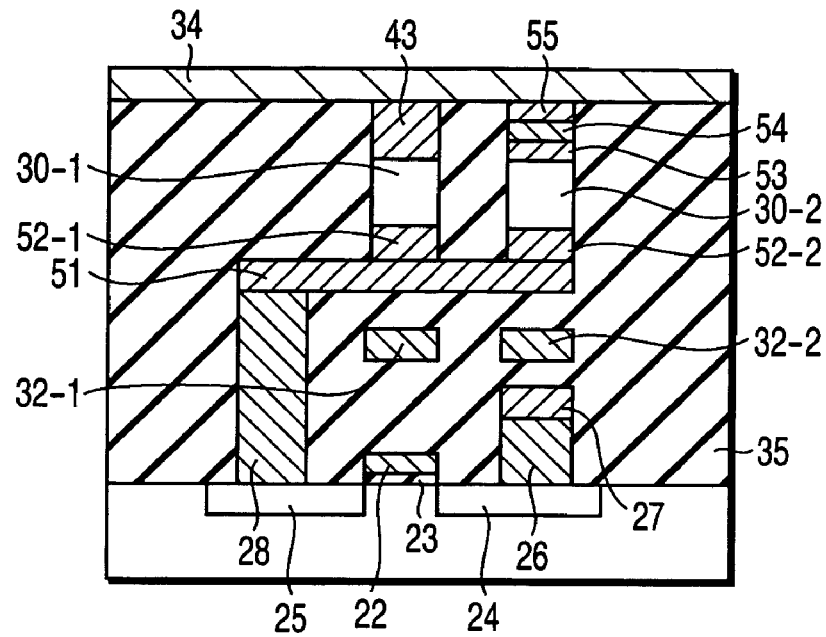
FIG. 10 is a sectional view showing the configuration of an MRAM according to a fourth embodiment of the present invention.

FIG. 10 is a sectional view showing the configuration of an MRAM according to a fourth embodiment of the present invention. In the present embodiment, the plurality of MTJ elements included in one block have the same resistance value, that is, the same characteristic. FIG. 10 shows that one block includes two MTJ elements.

The conductive layer 51 is provided above the drain region 25 via the contact plug 28. The MTJ element 30-1 is provided above the conductive layer 51 via a conductive layer 52-1. The read/write bit line (BL) 34 is provided above the MTJ element 30-1 via the conductive layer 43.

The MTJ element 30-2 and the fixed resistance element 54 are provided adjacent to the MTJ element 30-1. That is, the MTJ element 30-2 is provided on the conductive layer 51 via a conductive layer 52-2. The conductive layer 53, the fixed resistance element 54, and the conductive layer 55 are sequentially stacked on the MTJ element 30-2. The common bit line (BL) 34 is provided on the conductive layer 55.

Figure 11:
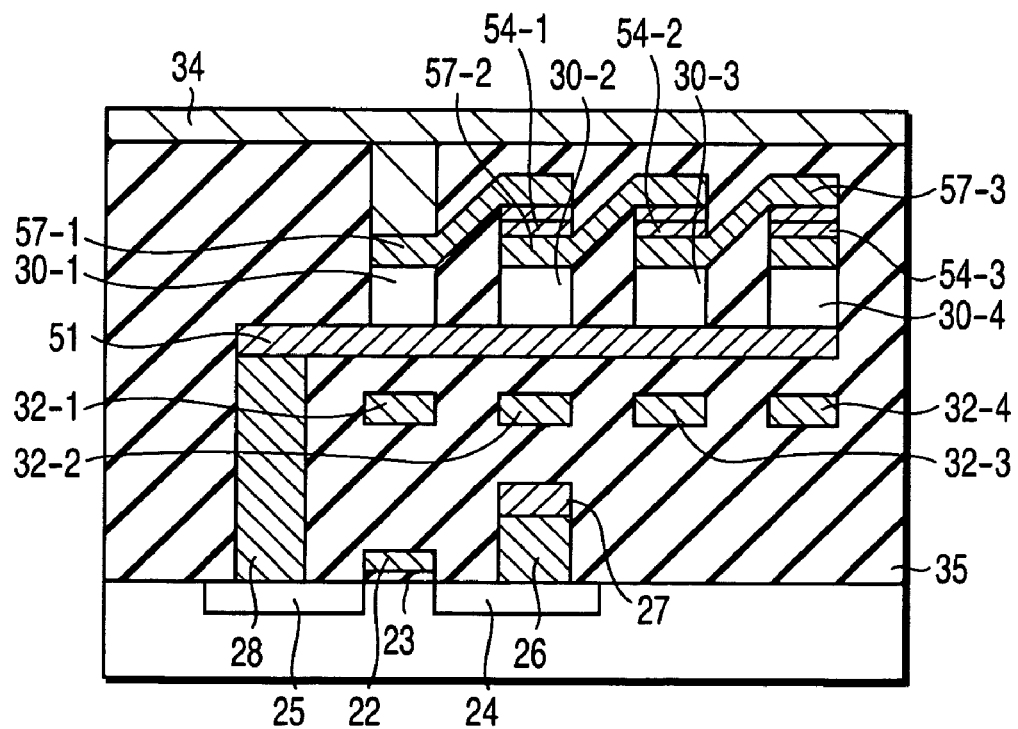
FIG. 11 is a sectional view showing the configuration of the MRAM having four MTJ elements.

FIG. 11 is a sectional view showing the configuration of an MRAM with four MTJ elements. The four MTJ elements 30-1 to 30-4 are sequentially provided on the conductive layer 51 adjacent to one another. The upper terminal of the MTJ element 30-1 is connected to one terminal of the fixed resistance element 54-1 via a conductive layer 57-1.

The other terminal of the fixed resistance terminal 54-1 is connected to the upper terminal of the MTJ element 30-2 and one terminal of the fixed resistance terminal 54-2 via a conductive layer 57-2. The other terminal of the fixed resistance terminal 54-2 is connected to the upper terminal of the MTJ element 30-3 and one terminal of the fixed resistance terminal 54-3 via a conductive layer 57-3. The other terminal of the fixed resistance terminal 54-3 is connected to the upper terminal of the MTJ element 30-4 via a conductive layer.

The fixed resistance element is composed of the same material as shown in the third embodiment. The MRAM configured as described above can exert effects similar to those of the third embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a plurality of variable resistance elements arranged in parallel between a first and second nodes and having resistance values which vary depending on data stored in the elements;
   a fixed resistance section which adds fixed resistance values to a plurality of current paths so that the plurality of current paths have the different resistance values, the plurality of current paths including the plurality of variable resistance elements between the first and second nodes;
   a selection transistor connected to the first node to perform selection on the plurality of variable resistance elements; and
   a bit line connected to the second node.

2. The magnetic memory device according to claim 1, wherein the plurality of variable resistance elements have the same resistance value.

3. The magnetic memory device according to claim 1, further comprising:
a plurality of write lines which write the data to the plurality of variable resistance elements.

4. The magnetic memory device according to claim 1, wherein the plurality of variable resistance elements store the data using a magnetoresistive effect.

5. The magnetic memory device according to claim 1, further comprising:
a read line connected to a gate of the selection transistor.

6. The magnetic memory device according to claim 1, further comprising:
a read circuit connected to the bit line.

7. A magnetic memory device comprising:
a plurality of variable resistance elements arranged in parallel between a first and second nodes and having resistance values which vary depending on data stored in the variable resistance elements;
a plurality of fixed resistance elements each connected between terminals of one of the variable resistance elements and the adjacent variable resistance element, which terminals are located on the same side of the variable resistance elements, the fixed resistance elements having fixed resistance values;
a selection transistor connected to the first node to perform selection on the plurality of variable resistance elements; and
a bit line connected to the second node.

8. The magnetic memory device according to claim 7, wherein the plurality of fixed resistance elements are connected to first-node-side terminals of the plurality of variable resistance elements.

9. The magnetic memory device according to claim 7, wherein the plurality of fixed resistance elements are connected to second-node-side terminals of the plurality of variable resistance elements.

10. The magnetic memory device according to claim 7, wherein the plurality of variable resistance elements have the same resistance value.

11. The magnetic memory device according to claim 7, wherein the plurality of fixed resistance elements have the same resistance value.

12. The magnetic memory device according to claim 7, wherein each of the fixed resistance elements is selected from a magnetoresistive element with fixed resistance value, polysilicon, alumina, silicon oxide film, or ruthenium oxide.

13. The magnetic memory device according to claim 7, further comprising:
a plurality of write lines which write the data to the plurality of variable resistance elements.

14. The magnetic memory device according to claim 7, wherein the plurality of variable resistance elements store the data using a magnetoresistive effect.

15. The magnetic memory device according to claim 7, further comprising:
a read line connected to a gate of the selection transistor.

16. The magnetic memory device according to claim 7, further comprising:
a read circuit connected to the bit line.

* * * * *